(12) United States Patent
Takagi (10) Patent No.: US 7,029,828 B2
(45) Date of Patent: Apr. 18, 2006

(54) METHOD FOR MANUFACTURING SURFACE ACOUSTIC WAVE DEVICE AND INSPECTING INSTRUMENT

(75) Inventor: Toshiyuki Takagi, Hokkaido (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 10/466,546

(22) PCT Filed: Oct. 1, 2001

(86) PCT No.: PCT/JP01/08639

§ 371 (c)(1),
(2), (4) Date: Jul. 24, 2003

(87) PCT Pub. No.: WO02/060054

PCT Pub. Date: Aug. 1, 2002

(65) Prior Publication Data

US 2004/0047982 A1    Mar. 11, 2004

(30) Foreign Application Priority Data

Jan. 25, 2001    (JP)    ............................. 2001-017507

(51) Int. Cl.
    H03H 9/25    (2006.01)
(52) U.S. Cl. .................. 430/318; 430/30; 430/319
(58) Field of Classification Search .............. None
    See application file for complete search history.

(56) References Cited

U.S. PATENT DOCUMENTS 5,512,746 A * 4/1996 Saito ........................ 250/310

FOREIGN PATENT DOCUMENTS

JP    11-298284    10/1999
JP    11-338147    12/1999

* cited by examiner

Primary Examiner—John A. McPherson
(74) Attorney, Agent, or Firm—Oblon, Spivak, McClelland, Maier & Neustadt, P.C.

(57) ABSTRACT

In a tester for a surface acoustic wave device used as a filter for high frequency bands in the field of mobile communications, the tester includes: an electron gun generating an electron beam to be first electrons; a condenser lens for converging the electron beam on a substrate; an electron beam scanning portion for scanning the electron beam on the substrate; a secondary electron detector detecting second electrons generating from the substrate by irradiated first electrons; a substrate holder holding the substrate; and a conductive grounding tool which can contact the metal film. The grounding tool includes a contacting head. The grounding tool includes: a contacting head that can contact the grounding tool and the metal film; an arm portion arranged at the end of the contacting head; a shaft arranged at the other end of the contacting head, and rotating the arm portion. The substrate has a two-layer structure, which includes: a circular piezo-electric substrate including lithium tantalate ($LiTaO_3$); and a metal film including aluminum (Al) formed on the piezo-electric substrate.

11 Claims, 9 Drawing Sheets

METHOD FOR MANUFACTURING SURFACE ACOUSTIC WAVE DEVICE AND INSPECTING INSTRUMENT

BACKGROUND OF THE INVENTION

1. Field of the Invention

The present invention relates to an inspection method for a manufacturing process of a surface acoustic wave device used in the field of mobile communications etc., and, more particularly, relates to an electrode line-width measurement method of the surface acoustic wave device, and a tester used therein.

2. Description of the Related Art

The field of use of a surface acoustic wave device is expanding, and use of high frequency bands in the field of mobile communications is especially increasing. The surface acoustic wave device is used as a filter for the high frequency bands. Center frequencies of passage bands in the filter are mainly determined by two-physical characteristics, which are the thickness and the line-width of comb-shaped-electrodes of surface acoustic wave devices. For this reason, in product quality control of the surface acoustic wave devices, it is important to precisely measure and inspect the line-widths of the comb-shaped-electrodes.

As a line-width inspection method, the line-width of the comb-shaped-electrodes is conventionally measured with an optical microscope. However, for instance in a surface acoustic wave device for high frequency bands used in US-PCS (United States-Personal Communications Services), comb-shaped-electrodes have line-widths of about 600 nm, while a specification range of products is as small as several tens of nm. Accordingly, such an optical line-width measurement system is not applicable to the measurement of line-width of the comb-shaped-electrodes in such surface acoustic wave device.

An existing instrument, which can measure up to about 600 nm line-width, in a line-width measurement system uses an electron beam. The line-width measurement system is used in inspection during a manufacturing process of semiconductor devices. The inventors used this electron beam line-width measurement system for the measurement of the line-width of surface acoustic wave devices. However, the line-width of surface acoustic wave devices could not be precisely measured with an electron beam line-width measurement system.

DISCLOSURE OF INVENTION

Upon examination by the inventors, it became clear that the causes of the difficulty in precisely measuring electrode line-width with the line-width measurement system using an electron beam were pyroelectricity and the insulation by the piezo-electric substrate used as a substrate material in the surface acoustic wave device.

Pyroelectricity is a property whereby the polarization of the piezo-electric substrate changes with temperature change, and polarization charges are generated on the substrate surface. Due to pyroelectricity of the piezo-electric substrate, the piezo-electric substrate is polarized after the manufacturing process with a temperature change. As a result, the surface of the piezo-electric substrate in which electrode parts are laminated becomes an anode. Therefore the surface attracted electrons are negatively charged. In addition, since the piezo-electric substrate is insulated, electrified electrons cannot be diffused to the perimeter of the piezo-electric substrate. Hence, when the line-width is measured with the line-width measurement system using an electron beam, the surface of the piezo-electric substrate is charged. Consequently, since the charged-up electrons repel the irradiated primary electrons, the beam cannot reach to the comb-shaped-electrodes and their proximity, so that the outline of the comb-shaped-electrodes will be vague. Accordingly, it is apparent that a highly precise measurement of the line-width is impossible due to the charged-up state.

Then, in order to prevent the charged-up state, an ionizer and a soft X-ray irradiation instrument are incorporated into the line-width measurement system. The ion-blowing irradiated electronic charges charged with an opposite polarity by the surface charged-up electrons, and soft X-rays, were irradiated to the piezo-electric substrate, at which the surface acoustic wave devices are arranged.

However, the methods for irradiating the ion and the soft X-rays have problems in that a long time is necessary for completely removing the charged-up electrons. In addition, charge-up due to the irradiated primary electrons and the electrons polarized at the surface of the piezo-electric substrate by heating due to beam irradiation for measuring the line-width cannot be avoided. For these reasons, when the same location is measured repeatedly, the measured line-width value may be different.

An object of the present invention is to solve the above problems. The present invention provides a method for manufacturing a surface acoustic wave device, which can be measured with high precision and with a high rate of reproduction of the measured values.

In addition, another object of the present invention is to provide a tester for a surface acoustic wave device, having high measurement precision, whereby shape measurement having a high rate of reproduction of the measured values is possible.

In order to achieve the above-described purposes, a first feature of the present invention inheres in a method for manufacturing a surface acoustic wave device, the method comprising: (a) a step of depositing a metal film on a piezo-electric substrate; (b) a step of coating a photosensitive resin film on the metal film; (c) a step of photo-exposing and developing the resin film, forming a photosensitive resin pattern, and selectively exposing a part of the metal film; (d) a step of grounding the metal film using the exposed metal film as a window for grounding; (e) a step of irradiating an electron beam to the piezo-electric substrate, and measuring the resin pattern while the metal film is grounded; (f) a step of etching the metal film using the photosensitive resin pattern as a mask, and forming a metal pattern; and (g) a step of removing the photosensitive resin pattern.

According to the first feature of the invention, by grounding the metal film on the piezo-electric substrate, and by measuring the photosensitive resin pattern, electrification on the piezo-electric substrate can be prevented, and therefore the shape of the photosensitive resin pattern can be measured with high reproducibility and high precision.

A second feature of the present invention inheres in a method for manufacturing a surface acoustic wave device, comprising: (a) a step of depositing a metal film on a piezo-electric substrate; (b) a step of coating a photosensitive resin film on the metal film; (c) a step of exposing and developing the resin film, and forming a resin pattern; (d) a step of etching the metal film using the resin pattern as a mask so as to form a metal pattern; (e) a step of removing the resin pattern; (f) a step of grounding a part of the metal pattern; and (g) a step of irradiating an electron beam to the piezo-electric substrate, and measuring the shape of the metal pattern electrically connected to the grounded part, when the part of the metal pattern is grounded.

According to the second feature of the invention, by grounding part of the metal patterns, and by measuring the metal pattern electrically connected with the grounded part, electrification on the piezo-electric substrate can be prevented, and therefore measurement of the shape of the metal patterns with high reproducibility and high precision becomes possible.

A third feature of the present invention inheres in a tester, comprising: (a) an electron gun for generating an electron beam; (b) a condenser lens for converging the electron beam; (c) an electron beam scanning portion for scanning the electron beam; (d) a detector for detecting secondary electrons generating from a measuring object by scanning of the electron beam; and (e) a grounding tool for connecting ground electrical potential to a metal film as one of a film at the under part of the measuring object, and the measuring object.

According to the third feature of the invention, by comprising the grounding tool in which the metal film is connected to grounding potential, the electronic beam can be irradiated without storing electrons on the piezo-electric substrate.

BEST MODE FOR CARRYING OUT THE INVENTION

An embodiment of the present invention will be described with reference to the accompanying drawings. It is to be noted that the same or similar reference numerals are applied to the same or similar parts and elements throughout the drawings, and the description of the same or similar parts and elements will be omitted or simplified. Generally, it will be appreciated that the various drawings are not drawn to scale from one figure to another nor inside a given figure, and in particular that the layer thickness are arbitrarily drawn for facilitating the reading of the drawings. In the following descriptions, numerous details are set forth such as specific signal values, etc. to provide a thorough understanding of the present invention. However, it will be obvious to those skilled in the art that the present invention may be practiced without such specific details.

Figure 1A:
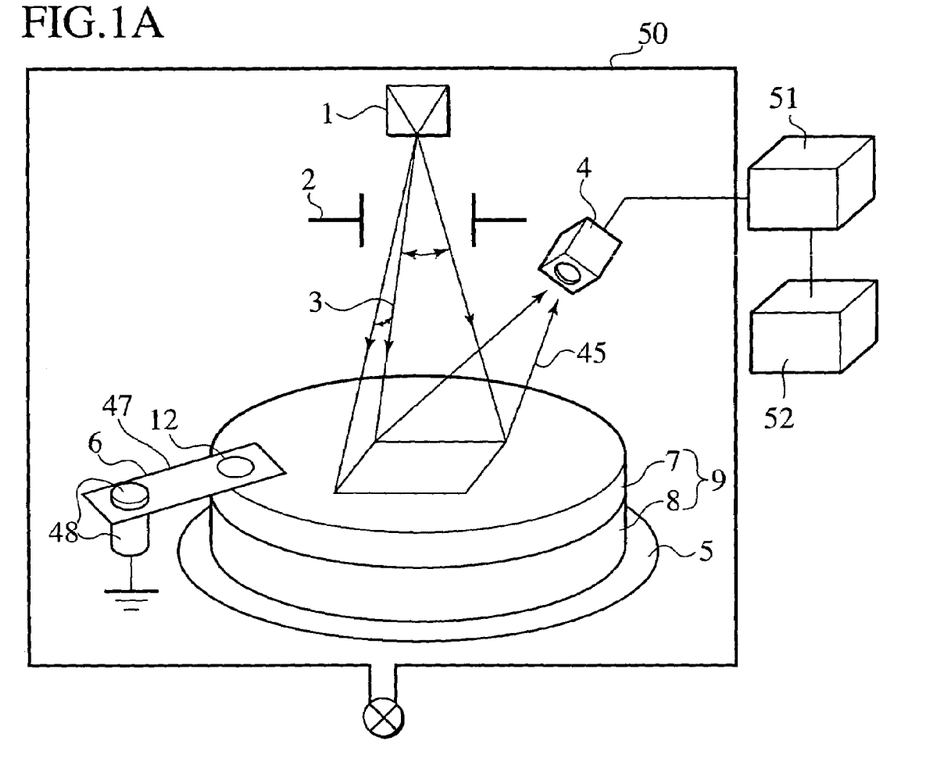
FIG. 1A is a schematic view explaining the configuration of a tester of a surface acoustic wave device according to an embodiment of the present invention.

As shown in FIG. 1A, a tester of a surface acoustic wave device according to an embodiment of the present invention includes an electron gun 1 for generating and irradiating an electron beam to provide primary electrons, a condenser lens 2 for converging the electron beam on the substrate 9, a scanning portion 2 for scanning the electron beam on the substrate 9, a secondary electron detector 4 for detecting second electrons generated from the substrate 9 irradiated by the primary electrons, a substrate holder 5 for holding the substrate 9, and a grounding tool 6. The grounding tool 6 is conductive and can be in contact with the metal film 7 on the measuring substrate 9. The grounding tool 6 includes a conductive contacting head 12, which can be in contact with the metal film 7, an arm portion 47 attached at the tip of the contacting head 12, and a shaft 48 arranged at the opposite side of the contacting head 12 of the arm portion 47. Furthermore, the tester includes a vacuum chamber 50 accommodating the electron gun 1 and the substrate 9, an picture formation unit 51 for forming a picture based on the detected amount of the secondary electrons from each position on the substrate 9 on which the electron beam was scanned, and a critical dimension measurement unit 52 for detecting the outline of the comb-shaped-electrodes based on the formed picture, and measuring the line-width thereof.

In addition, the substrate 9 has a two-layer structure, which consists of a circular piezo-electric substrate 8 made of lithium tantalate ($LiTaO_3$), and a metal film 7 made of aluminum (Al) formed on the piezo-electric substrate 9. Lithium niobate ($LiNbO_3$) may be used as materials of which the piezo-electric substrate 8 made, instead of $LiTaO_3$. The materials, which make the piezo-electric substrate 8, do not need to be $LiTaO_3$ or $LiNbO_3$.

Figure 1B:
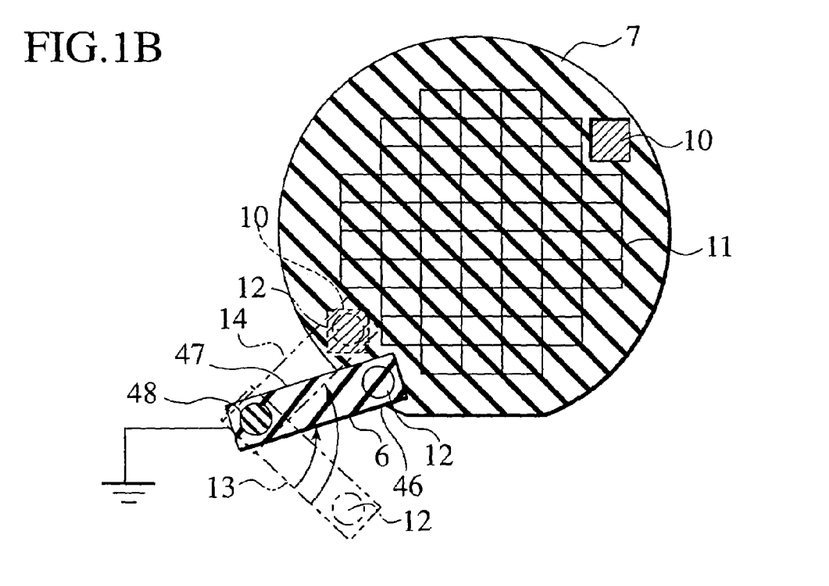
FIG. 1B is a plane view corresponding to FIG. 1A.
Figure 2:
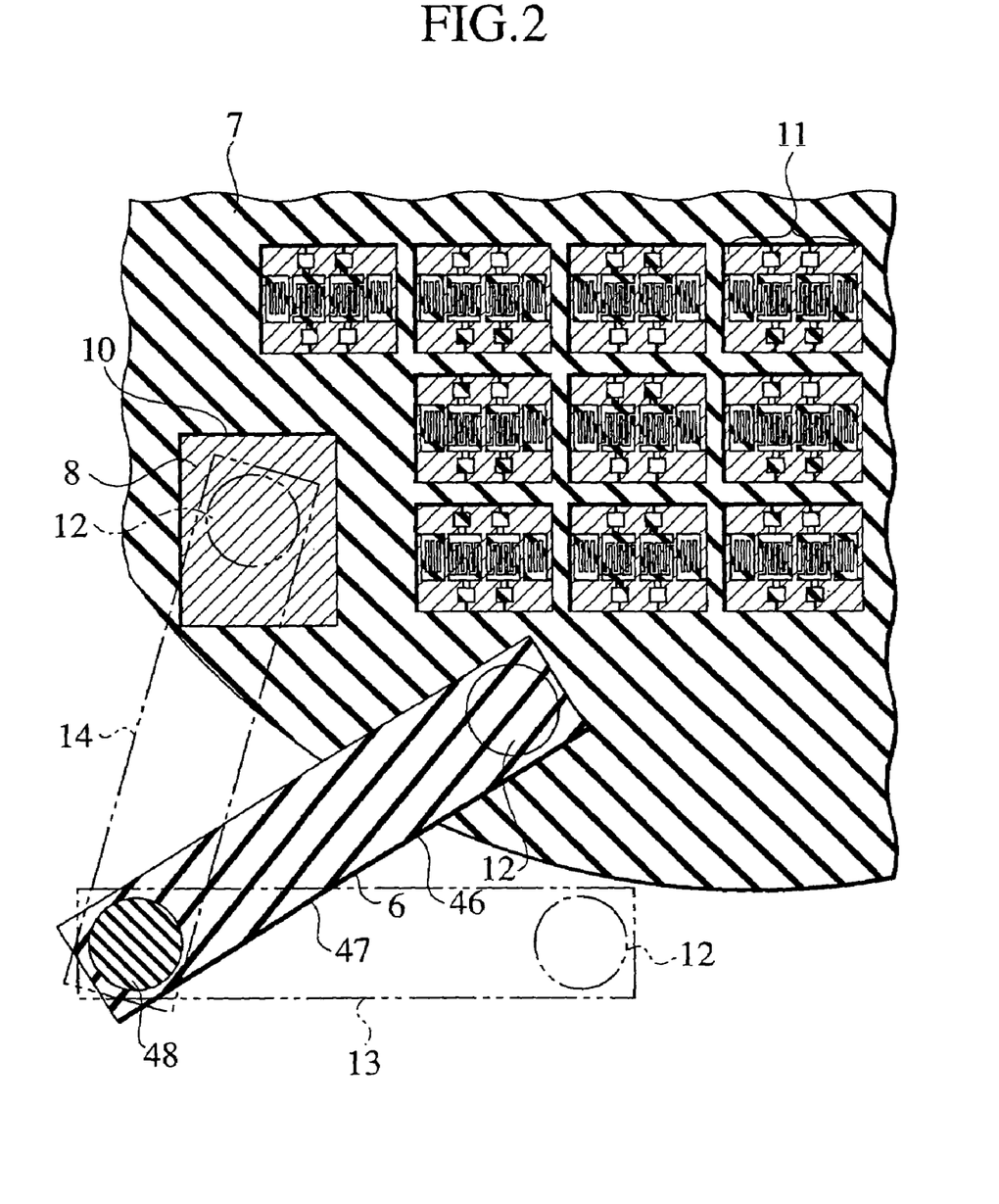
FIG. 2 is a plane view explaining the positional relationship between a grounding tool of the tester of the surface acoustic wave device and a piezo-electric substrate according to the embodiment of the present invention.

As shown in FIG. 1B, metal patterns for constituting the surface acoustic wave device 11 are formed by the metal film 7 (refer to FIG. 2 for details of the metal patterns). The metal film 7 is disposed at a position, which can provide contact with the grounding tool 6. In addition, an opening 10 for contact, formed in the metal part 7, is also arranged at a circumferential part of the substrate 9 which can also contact with the grounding tool 6.

As shown in FIG. 2, the grounding tool 6 is arranged in the position 13 beside the substrate 9. The grounding tool 6 is movable on the shaft 48 as a center thereof. The grounding tool 6 can move to the position 46 where the contacting head 12 can contact the metal film 7, and to the position 14 where the contacting head 12 corresponds with the opening 10. The contacting head 12 is also movable so as not to contact with the metal film 7 after measurement.

Figure 3:
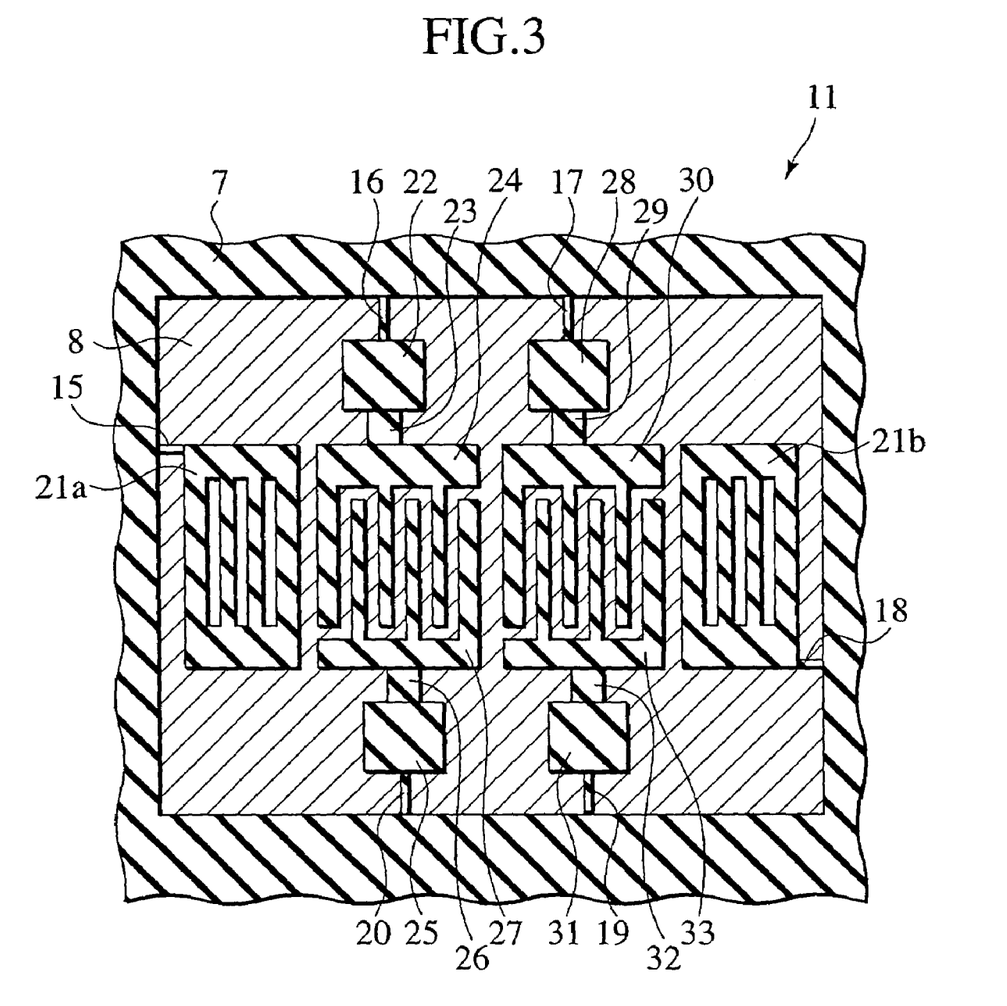
FIG. 3 is a plane view explaining an arrangement position of the piezo-electric substrate of the surface acoustic wave device.

As shown in FIG. 3, the surface acoustic wave device 11 has plural metal patterns consisting of the metal film 7. The metal patterns include comb-shaped-electrodes 24 and 27 for input, comb-shaped-electrodes 30 and 33 for output; bonding pads 22, 25, 28, and 31, reflectors 21a and 21b, and ground lines 15 to 20. The comb-shaped-electrodes 24, 27, 30, and 33, and the bonding pads 22, 25, 28, and 31 are respectively connected to each other with connection lines 23, 26, 29, and 32. In addition, the bonding pads 22, 25, 28, and 31, and the metal film 7 on dicing lines are connected with the ground lines 16, 20, 17, and 19. The reflectors 21a and 21b, and the metal film 7 on the dicing lines are connected with the ground lines 15 and 18.

For these reasons, the comb-shaped-electrodes 24, 27, 30, and 33, and the reflectors 21a and 21b, which are electrically connected to the metal film 7 on the circumference region of the substrate 9 through the ground lines, have the same electric potentials.

In the following, a method for manufacturing the surface acoustic wave device and an inspection method for the surface acoustic wave device according to the embodiment of the present invention will be described.

Figure 4A:
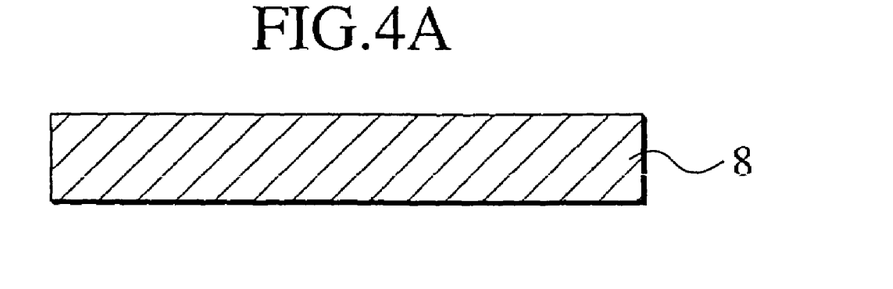
FIGS. 4A to 4C are sectional views explaining the method for manufacturing the surface acoustic wave device according to the embodiment of the present invention.
Figure 4B:
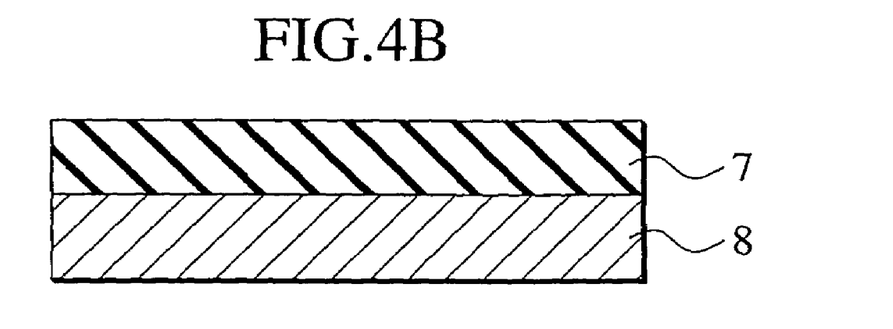

(a) To begin with, the piezo-electric substrate 8 is prepared as shown in FIG. 4A. In addition, as shown in FIG. 4B, the metal film 7 is deposited on the piezo-electric substrate 8 by sputtering. When aluminum (Al) alloys are used as a target, an Al alloy film as the metal film 7 can be deposited on the piezo-electric substrate 8.

Figure 4C:
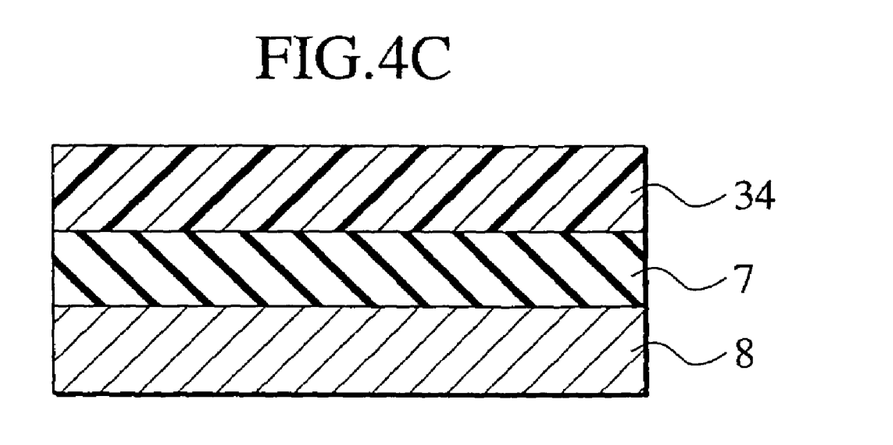

(b) Next, as shown in FIG. 4C, a photosensitive resin (a photo resist) 34 is spin coated on the metal film 7.

Figure 5A:
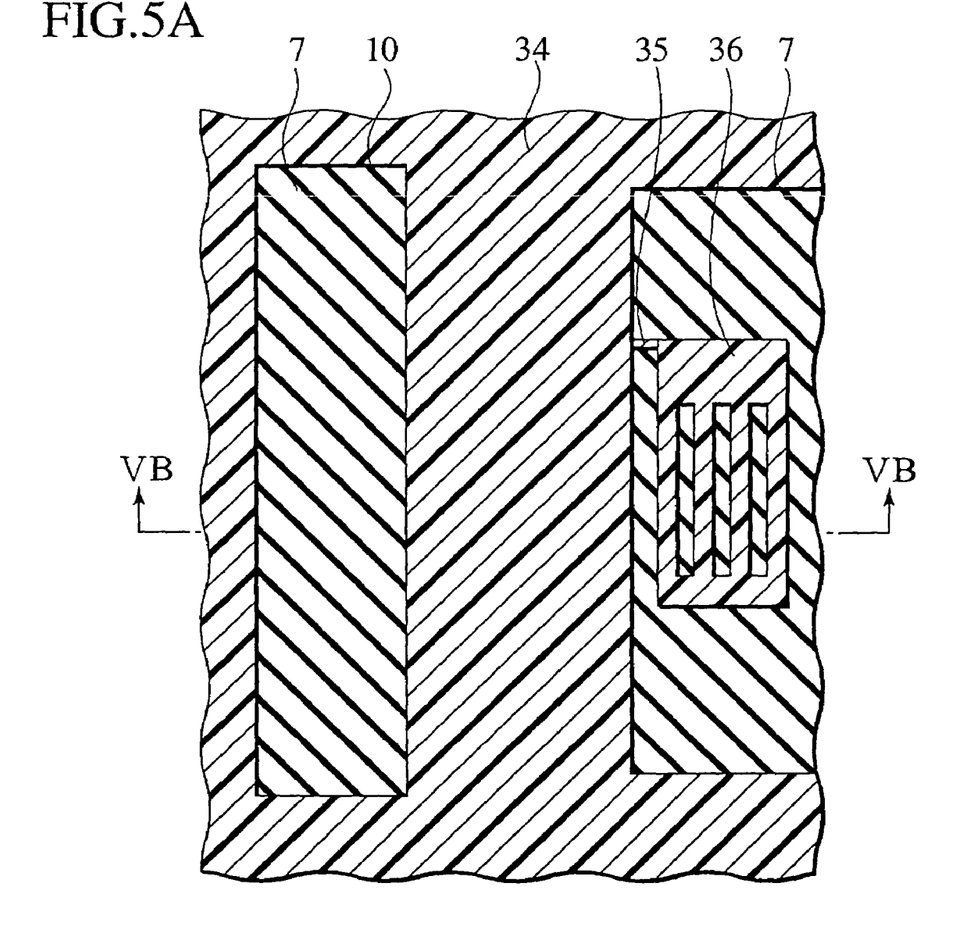
FIG. 5A is a plane view explaining the method for manufacturing the surface acoustic wave device according to the embodiment of the present invention, following the step shown in FIG. 4C.
Figure 5B:
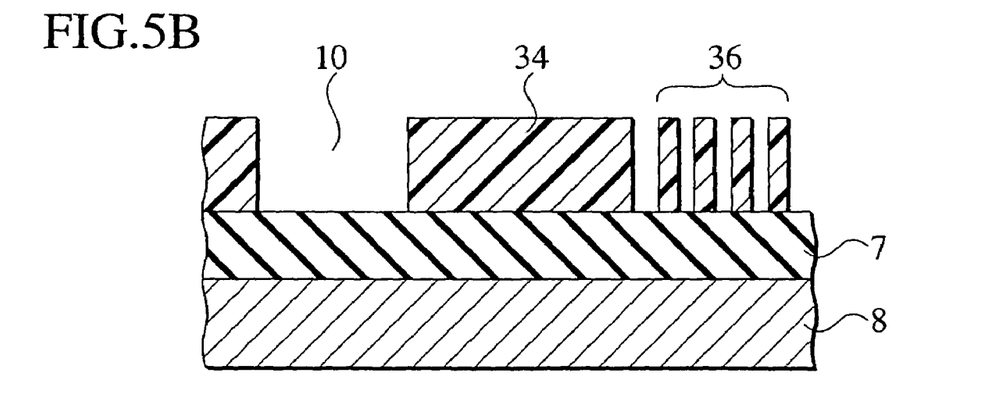
FIG. 5B is a sectional view along the VB—VB direction of FIG. 5A.
Figure 6A:
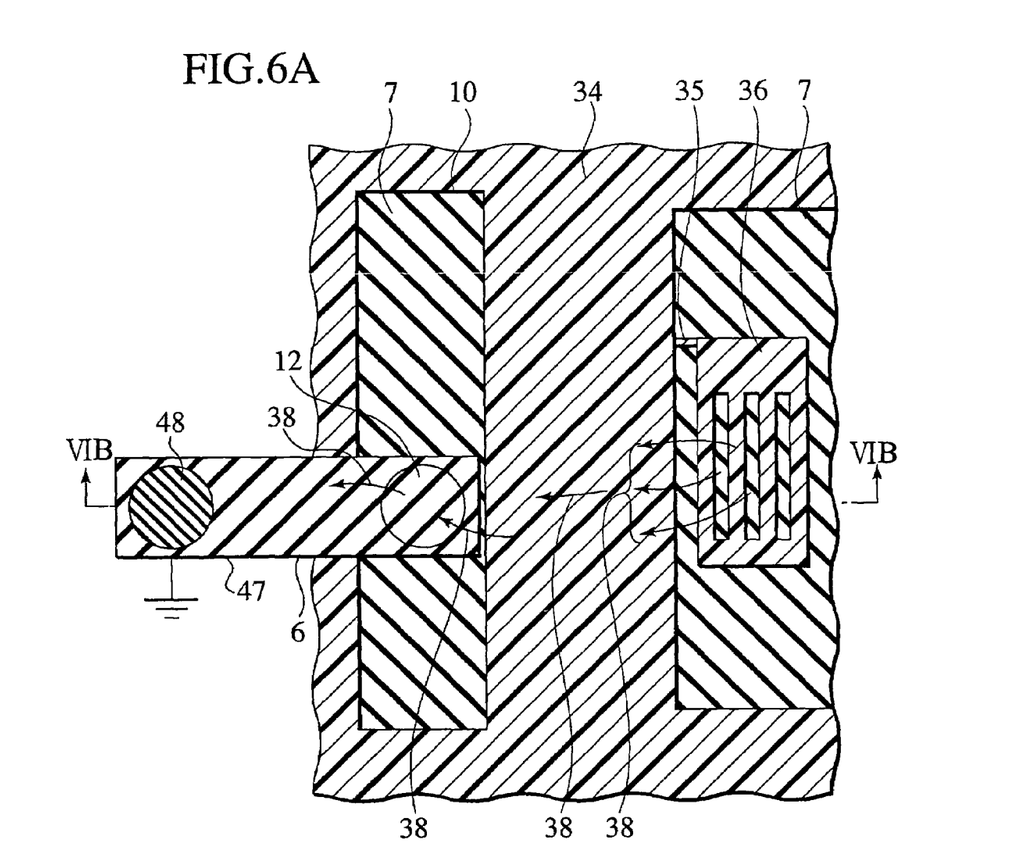
FIG. 6A is a plane view explaining the method for manufacturing the surface acoustic wave device according to the embodiment of the present invention, following the step shown in FIG. 5A and FIG. 5B.
Figure 6B:
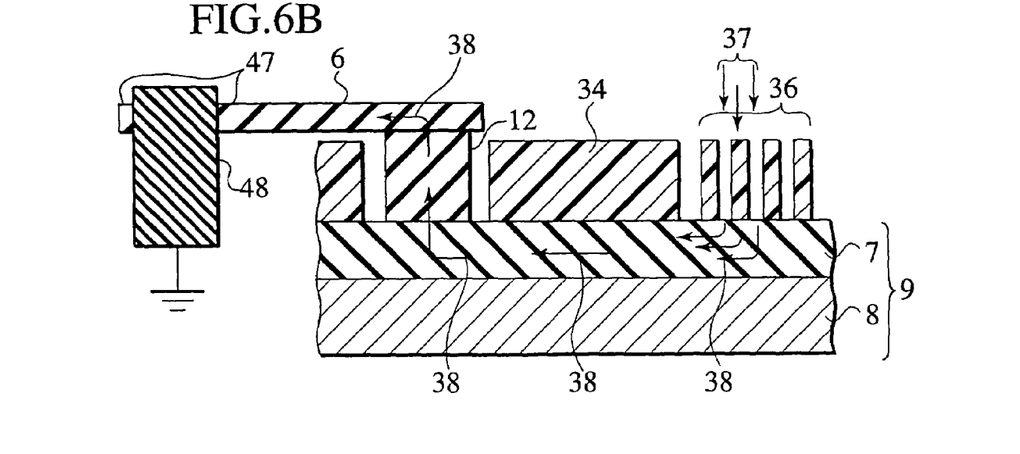
FIG. 6B is a sectional view along the VIB—VIB direction of FIG. 6A.

(c) Next, a photolithography process is carried out. The photosensitive resin film 34 is selectively exposed using mask patterns shaped such as comb-shaped-electrodes and reflectors. After exposure, the exposed parts of the photosensitive resin film 34 are selectively removed by developing and rinsing, as shown in FIG. 5A and FIG. 5B, thus photosensitive resin patterns 35 and 36 etc. are formed. The photosensitive resin pattern 36 is connected to the photosensitive resin film 34 through the photosensitive resin pattern 35. In addition, in this photolithography process, the opening 10 is also formed simultaneously. The photosensitive resin film 34 at the position of the opening 10 is removed in a developing process (the contacting head 12 contacts with the metal film 7 inside of this opening 10, as shown in FIG. 6B.)

(d) Next, the shape of the photosensitive resin patterns is measured with the tester shown in FIG. 1A. First, the developed piezo-electric substrate 8 is arranged on the substrate holder 5 inside of the vacuum chamber 50 of the tester. As shown in FIG. 6A and FIG. 6B, the grounding tool 6 is moved, and the contacting head 12 contacts the metal film 7 at a bottom of the opening 10. In the state where the contacting head 12 of the grounding tool 6 contacts the metal film 7, the geometry of the photosensitive resin patterns including a line-width of the resin pattern 36 of the surface acoustic wave device is measured. First, in order to get a picture of the photosensitive resin pattern 36, the electron beam 3 is irradiated to the substrate 9 as shown in FIG. 1A. This irradiated electron beam 3 is equivalent to an electron beam 37 shown in FIG. 6B.

(e) Next, it is judged whether the measured values are within the range of specifications. If a measured value is within the range of the specifications, the process will advance to the next step. On the other hand, if a measured value is outside the range of the specifications, and the photo resists such as photosensitive resin films 34 to 36 are removed, and each process shown in FIGS. 4C to 6B may be repeated with adjusted exposure conditions. As thus described, since an accurate measurement is made possible, products that are outside the range of the specifications can be prevented from advancing to the next process. As a result, loss in processing can be reduced, and product yield can be improved.

(f) Next, the grounding tool 6 is separated from the metal film 7, and the piezo-electric substrate 8 is automatically taken out of the tester.

(g) The metal film 7 is etched using the photosensitive resin film 34 to 36 as a mask. The metal film 7 is made of, for instance, aluminum alloy, and anisotropic etching is performed by the reactivity ion etching (RIE) method using a chlorine ($Cl_2$) based gas.

Figure 7A:
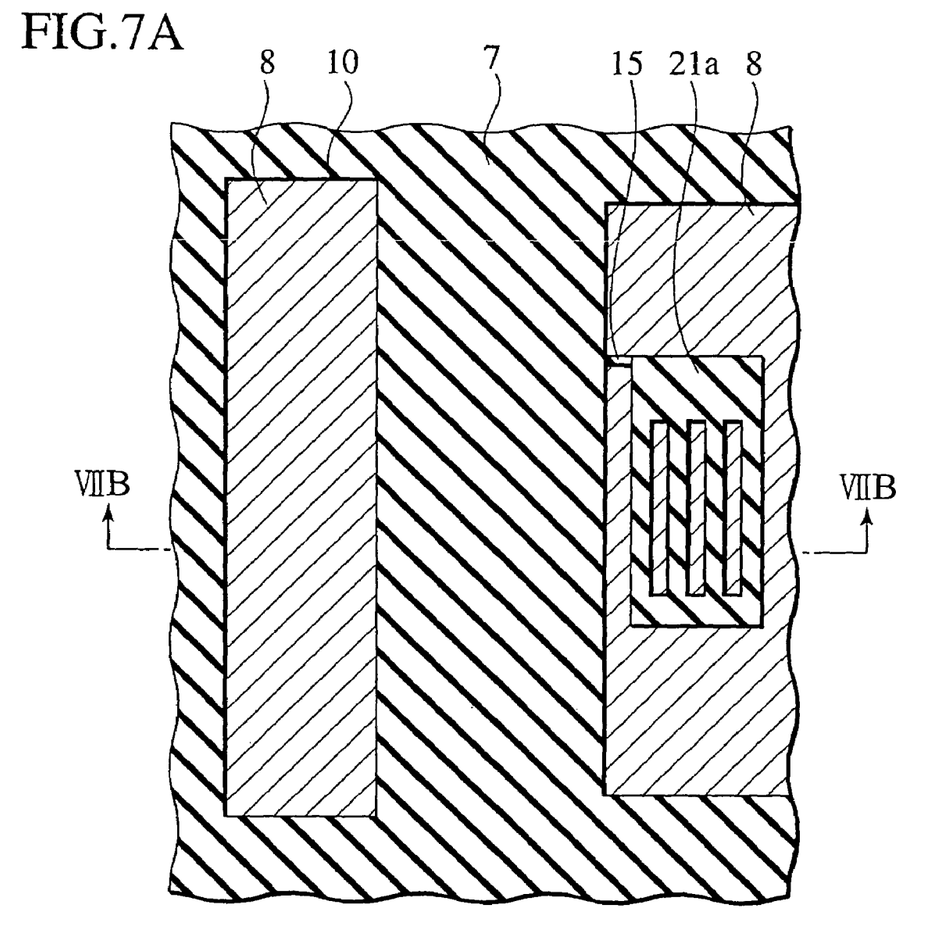
FIG. 7A is a plane view explaining the method for manufacturing the surface acoustic wave device according to the embodiment of the present invention, following the step shown in FIG. 6A and FIG. 6B.
Figure 7B:
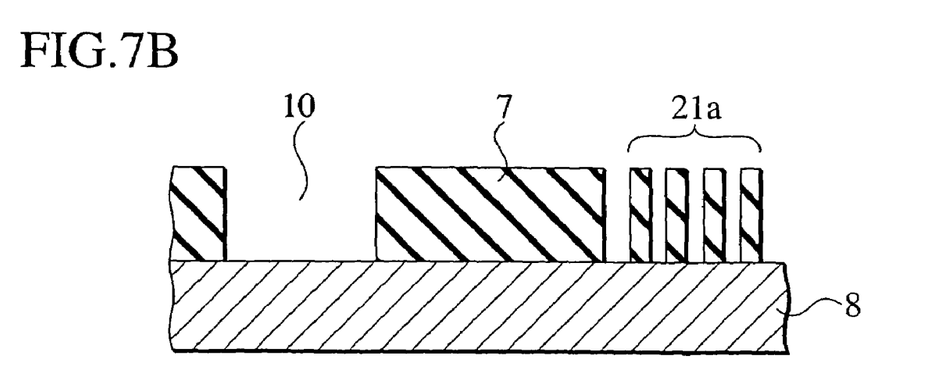
FIG. 7B is a sectional view along the VIIB—VIIB direction of FIG. 7A.

(h) Photo resists like the photosensitive resin films 34 to 36 are removed by plasma ashing using oxygen ($O_2$) based gas. As a result, as shown in FIG. 7A and FIG. 7B, the metal patterns, such as a reflector 21a and the ground line 15, are formed on the piezo-electric substrate 8. The metal pattern such as the reflector 21a is electrically connected to the metal film 7 through the ground line such as the ground line 15.

Figure 8A:
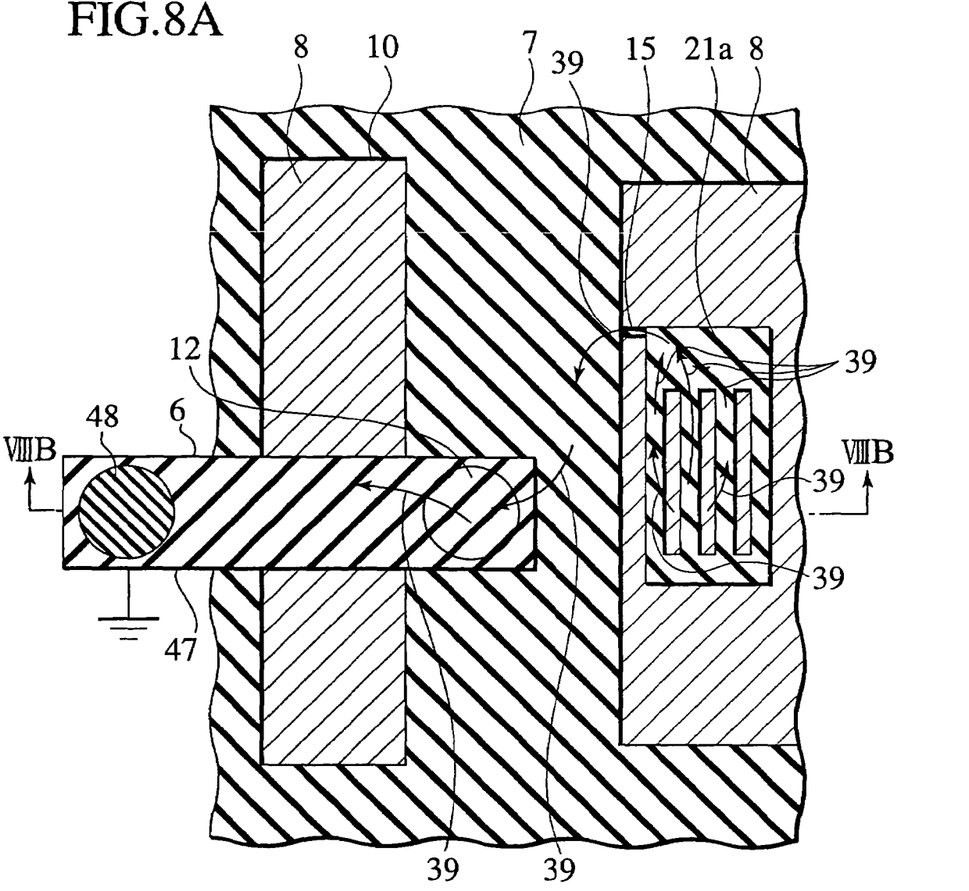
FIG. 8A is a plane view explaining the method for manufacturing the surface acoustic wave device according to the embodiment of the present invention, following the step shown in FIG. 7A and FIG. 7B.
Figure 8B:
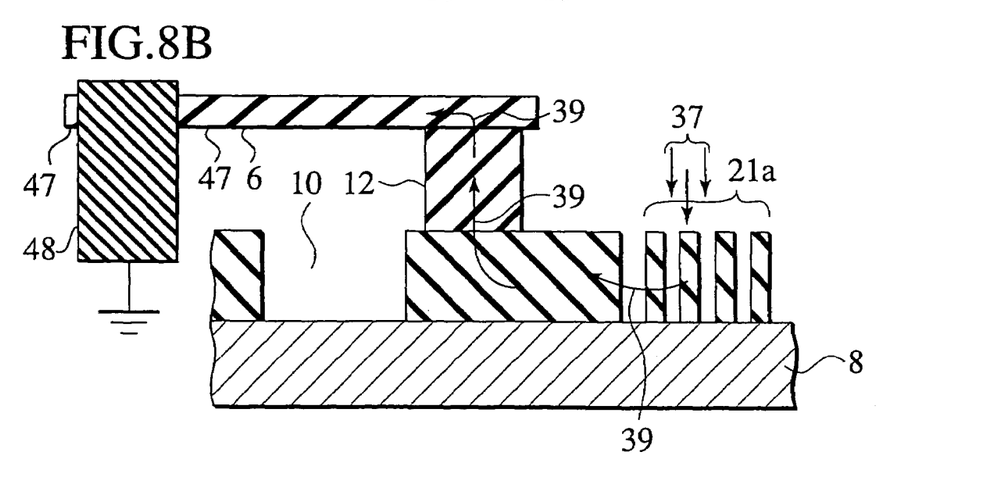
FIG. 8B is a sectional view along the VIIIB—VIIIB direction of FIG. 8A.

(i) The line-widths of the patterns, such as the reflector 21a formed on the piezo-electric substrate 8, are measured. The measurement is carried out in the same way as the shape measurement of photosensitive resin patterns. In this measurement, the position of the metal pattern 7 that contacts the contacting head 12 is different from the case measuring shape of the photosensitive resin patterns. That is, as shown in FIG. 8A and FIG. 8B, the grounding tool 6 is moved, and the contacting head 12 contacts the position of the metal film 7 electrically connected to the metal pattern that is a measurement object, such the reflector 21a. For this reason, the current 39 of electrons is formed.

(j) Next, it is determined whether measured values are within the range of the specifications. If the measured value is within the range of the specifications, the process can advance to the following step.

Figure 9A:
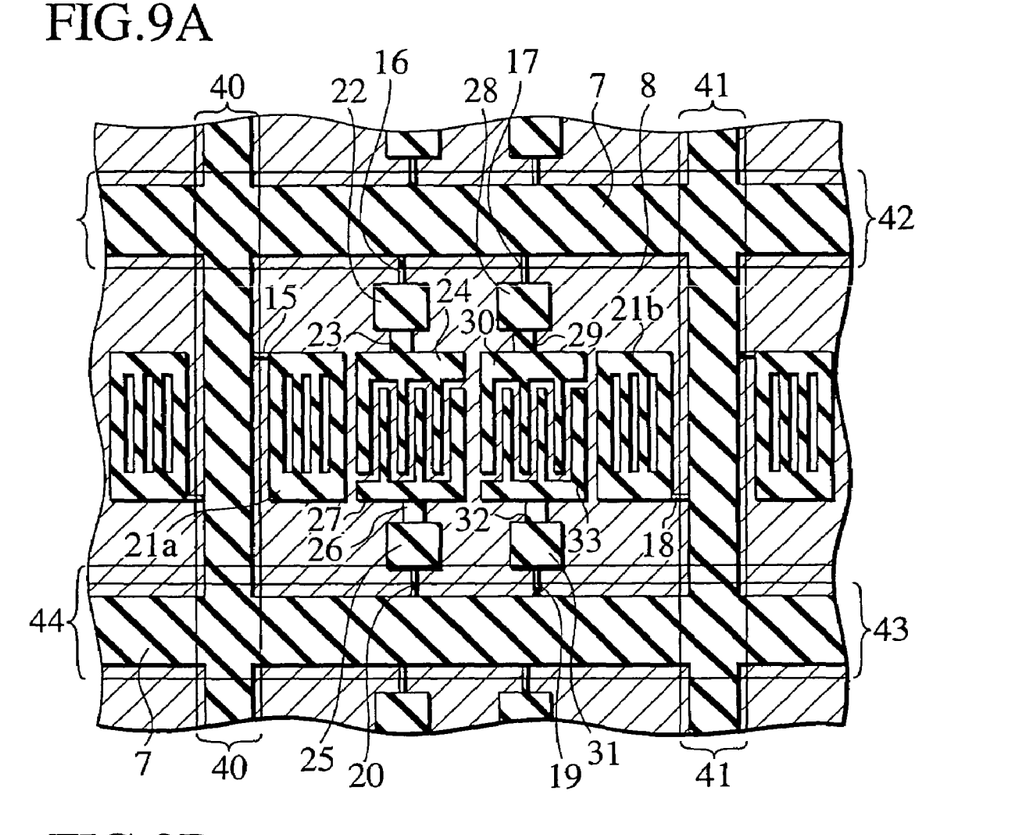
FIG. 9A is a plane view explaining the method for manufacturing the surface acoustic wave device according to the embodiment of the present invention, following the step shown in FIG. 8A and FIG. 8B.
Figure 9B:
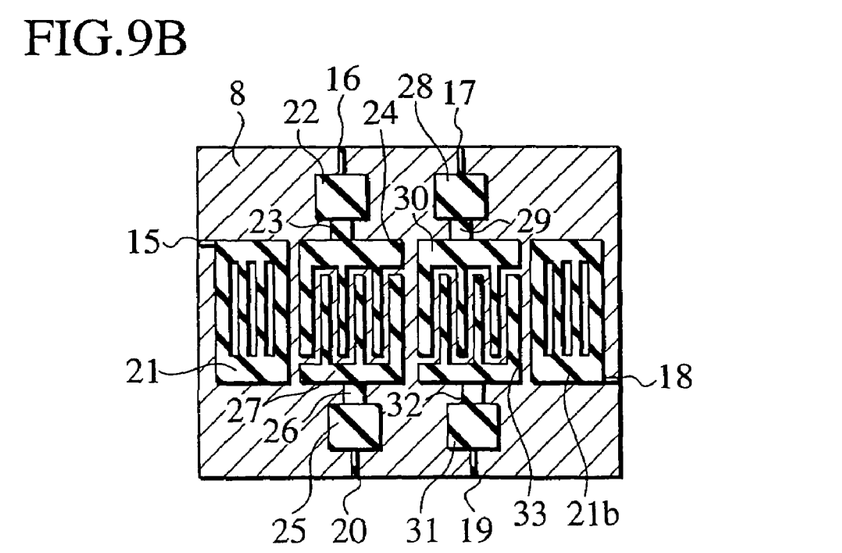
FIG. 9B is a plane view explaining the method for manufacturing the surface acoustic wave device according to the embodiment of the present invention, following the step shown in FIG. 9A.

(k) The piezo-electric substrate 8 is diced, and it is split into individual surface acoustic wave devices 11. As shown in FIG. 9A, before dicing, for instance, the metal patterns such as bonding pads 22 and 28 are electrically connected to the metal film 7 on a dicing line 42 through ground lines such as the ground lines 16 and 17. In dicing, the width of the dicing lines 40 to 43 are set more broadly than the width of the metal film 7 in order to cut these electrical connections. As shown in FIG. 9B, in the surface acoustic wave device 11, the ground lines 15 to 20 electrically connect the comb-shaped-electrodes 24, 27, 30, and 33, and the reflectors 21a and 21b to the outer most circumferential part. In addition, in the case where the dicing line 44 includes a part of the bonding pads 25 and 31 such as the dicing line 44 shown in FIG. 9A, the bonding pads 25 and 31 serves as the metal film 7 in the outer most circumferential part.

(l) Finally, die bonding, wire bonding, and packaging, etc. are carried out on the surface acoustic wave devices 11; thereby the surface acoustic wave devices are completed.

As shown in FIG. 6A and FIG. 6B, the current 38 of electrons is formed when the contacting head 12 of the grounding tool 6 contacts the metal film 7. The current 38 of electrons includes: (a) electrons charged on the piezo-electric substrate 8 by temperature change in the manufacturing process; (b) primary electrons irradiated by the electron beam; and (c) electrons further generated on the piezo-electric substrate 8 since the substrate 8 is further polarized by heating caused by the beam irradiation. The current 38 runs from the metal film 7 into finally the grounding tool 6 so as to reduce an incline of electrical current potential. The current 38 suppress to accumulate electrons on the piezo-electric substrate 8 in resin patterns such as the photosensitive resin pattern 36, which are used as a measurement object and in proximity of the patterns. Consequently, a trajectory of the electron beam 37 is not deflected, and highly precise and reproducible measurements of the shape of photosensitive resin patterns are possible.

The line-width of the comb-shaped photosensitive resin pattern was respectively measured with the tester according to the embodiment of the present invention and with a conventional line-width-measurement system without the grounding tool 6, and the result was compared. As a result of measuring the 500 nm line-width of the comb-shaped photosensitive resin pattern 30 times, a standard deviation value was about 1 nm by the measurement method according to the embodiment of the present invention. On the other hand, a standard deviation was about 5 nm by the conventional measurement method without the grounding tool 6. This demonstrated that highly precise and highly reproducible measurements are possible using the measurement method according to the embodiment of the present invention.

In addition, as shown in FIG. 8A and FIG. 8B, in a state where the contacting head 12 of the grounding tool 6 is in contact with the metal film 7, the current 39 of electrons includes: (a) electrons further charged on the piezo-electric substrate 8 by polarization due to temperature change in the manufacturing process; (b) primary electrons irradiated by the beam; and (c) electrons further charged on the piezo-electric substrate 8 by heating caused by irradiation. The flow 39 of electrons runs from the metal film 7 into the grounding tool 6 through the ground line 15 so as to reduce an incline of electrical current potential. The flow 39 stops electrons from accumulating in the piezo-electric substrate 8 of the metal film 7, such as the reflector 21a used a measurement object, and in proximity to the object. Accordingly, a trajectory of the electron beam 37 is not deflected, and highly precise and reproducible measurements of the shape of photosensitive resin patterns become possible.

The line-width of the comb-shaped-electrode, which is a metal pattern, was measured with the tester according to the embodiment of the present invention and with the conventional line-width-measurement system without the grounding tool 6 respectively, and compared. As a result of measuring the comb-shaped-electrode having a 500 nm line wide 30 times, the standard deviation value was about 1 nm by the measurement method according to the embodiment of the present invention. However, the standard deviation was about 5 nm by the conventional measurement method without the grounding tool 6. This demonstrated that highly precise and highly reproducible measurements are possible using the measurement method according to the embodiment of the present invention.

In addition, in the embodiment of the present invention, a measurement in a case where the line-width of both the resin patterns and the metal patterns is less than or equal to 2.0 μm and more than 0.35 μm is possible.

In addition, when the reflector is measured, since the reflector is easier to ground than the comb-shaped-electrode, the shape of the reflector can be measured more precisely. This is because, for instance, in a case where the reflector 21a is measured, the reflector 21a, directly connected to the ground line 15, becomes charged less easily than the comb-shaped-electrode 24, which is far from a ground line.

The present invention may be embodied in other specific forms without departing from the spirit or essential characteristics thereof. The embodiments are therefore to be considered in all respects as illustrative and not restrictive. It will be obvious to those skilled in the art that various embodiments of the present invention may be practiced.

For example, materials and quantity of material parts are in one of the embodiments of the present invention. Even if other materials replace these materials, technical effectiveness does not change. For example, technical effectiveness does not change when lithium tetraborate ($LiB_4O_7$) is used as a piezo-electric substrate.

In addition, in the embodiment of the present invention, the grounding tool 6 may further include other elements, like a clamp portion (a spring portion) holding the contacting head 12 in the substrate 9, and a drive portion rotating the shaft 48. Furthermore, the grounding tool 6 may further have a portion moving the arm portion 47 from top and bottom and right and left.

In addition, in the embodiment of the present invention, the metal film 7 based on Al is deposited on the piezo-electric substrate 8. Here, effectiveness is not changed even in a case where the metal film consisting of materials different from Al is deposited on the piezo-electric substrate 8 and in a case of a multi-layer structure having different laminated materials. In addition, the type and shape of a photosensitive resin pattern and a metal pattern are not particularly limited, for instance, like comb-shaped patterns. Furthermore, in the embodiment of the present invention, the line-width of the photosensitive resin pattern and the line-width of the comb-shaped-electrode of the metal patterns are measured. Here for example, the line-width and the shape are positions, such as the photosensitive resin pattern 35 and the reflector 21a, which are necessary in quality control may be measured and checked. Furthermore, the number of times of measurement can be performed is not particularly limited.

For these reasons, it is obvious that the present invention includes various embodiments, which have not been described above.

The invention claimed is:

1. A method for manufacturing a surface acoustic wave device, comprising:
   a step of depositing a metal film on a piezo-electric substrate;
   a step of coating a photosensitive resin film on the metal film;
   a step of exposing and developing the photosensitive resin film, and forming a photosensitive resin pattern, and selectively exposing a part of the metal film;
   a step of grounding the metal film using the exposed metal film as a window for grounding;
   a step of irradiating an electron beam to the piezo-electric substrate, and measuring the photosensitive resin pattern when the metal film is grounded;
   a step of etching the metal film using the photosensitive resin pattern as a mask, and forming a metal pattern; and
   a step of removing the photosensitive resin pattern.

2. The method according to claim 1, wherein the line-width of the resin pattern is less than 2.0 μm and more than 0.35 μm.

3. The method according to claim 1, wherein the piezo-electric substrate consists of one of lithium tantalate (LiTaO$_3$), and lithium niobate (LiNbO$_3$).

4. The method according to claim 1, wherein the metal film is grounded by contacting a contacting head of a grounding tool with the exposed metal film.

5. The method according to claim 1, wherein whether the measured photosensitive resin pattern is within a range of specifications is determined after the step of measuring the shape of the photosensitive resin pattern.

6. The method according to claim 4, further comprising:
   a step of grounding the metal film electrically connected to the metal pattern by contacting the contacting head of the grounding tool with the metal film, after the step of removing the resin pattern; and,
   a step of irradiating the electron beam to the piezo-electric substrate, and measuring the shape of the metal pattern when the metal film is grounded.

7. A method for manufacturing a surface acoustic wave device, comprising:
   a step of depositing a metal film on a piezo-electric substrate;
   a step of coating a photosensitive resin film on the metal film;
   a step of exposing and developing the photosensitive resin film, and forming a resin pattern;
   a step of etching the metal film using the photosensitive resin pattern as a mask so as to form a metal pattern;
   a step of removing the photosensitive resin pattern;
   a step of grounding a part of the metal pattern; and
   a step of irradiating an electron beam to the piezo-electric substrate, and measuring the shape of the metal pattern electrically connected to the grounded part, when the part of the metal pattern is grounded.

8. The method according to claim 7, wherein the linewidth of the metal pattern is less than 2.0 μm and more than 0.35 μm.

9. The method according to claim 7, wherein the piezo-electric substrate consists of one of lithium tantalate (LiTaO$_3$), and lithium niobate (LiNbO$_3$).

10. The method according to claim 7, wherein whether the shape of the measured metal pattern is within the range of specifications is determined, after the step of measuring the shape of the metal pattern.

11. The method according to claim 7, wherein the metal patterns, used as a shape measurement object, are patterns of a reflector.

* * * * *